United States Patent
Chiang et al.

(10) Patent No.: US 10,622,480 B2
(45) Date of Patent: Apr. 14, 2020

(54) FORMING GATE STACKS OF FINFETS THROUGH OXIDATION

(71) Applicant: Taiwan Semiconductor Manufacturing Company, Ltd., Hsinchu (TW)

(72) Inventors: Kuo-Cheng Chiang, Zhubei (TW); Jiun-Jia Huang, Beigang Township (TW); Chao-Hsiung Wang, Hsinchu (TW); Chi-Wen Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 100 days.

(21) Appl. No.: 15/832,125

(22) Filed: Dec. 5, 2017

(65) Prior Publication Data

US 2018/0097097 A1 Apr. 5, 2018

Related U.S. Application Data

(63) Continuation of application No. 14/017,036, filed on Sep. 3, 2013, now Pat. No. 9,859,429, which is a
(Continued)

(51) Int. Cl.
*H01L 21/306* (2006.01)
*H01L 29/78* (2006.01)
*H01L 29/786* (2006.01)

(52) U.S. Cl.
CPC ........ *H01L 29/785* (2013.01); *H01L 29/7849* (2013.01); *H01L 29/78696* (2013.01)

(58) Field of Classification Search
CPC .................................. H01L 29/66818
See application file for complete search history.

(56) References Cited

U.S. PATENT DOCUMENTS 6,359,311 B1 3/2002 Colinge et al.
8,502,263 B2 8/2013 Li et al.
(Continued)

FOREIGN PATENT DOCUMENTS

CN         1368756 A      9/2002
KR   1020110098594 A      9/2011
WO      2006006438 A1     1/2006

OTHER PUBLICATIONS

Gas et al., "Diffusion of Sb, Ga, Ge, and As in TiSi2, AIP Journal of Applied Physics," vol. 63, Jan. 1988, 12 pages.
(Continued)

*Primary Examiner* — Daniel Whalen
(74) *Attorney, Agent, or Firm* — Slater Matsil, LLP

(57) ABSTRACT

An integrated circuit structure includes a semiconductor substrate, and isolation regions extending into the semiconductor substrate, wherein the isolation regions have opposite sidewalls facing each other. A fin structure includes a silicon fin higher than top surfaces of the isolation regions, a germanium-containing semiconductor region overlapped by the silicon fin, silicon oxide regions on opposite sides of the germanium-containing semiconductor region, and a germanium-containing semiconductor layer between and in contact with the silicon fin and one of the silicon oxide regions.

20 Claims, 18 Drawing Sheets

Related U.S. Application Data continuation-in-part of application No. 13/740,373, filed on Jan. 14, 2013, now Pat. No. 8,901,607, and a continuation-in-part of application No. 13/902,322, filed on May 24, 2013, now Pat. No. 9,318,606.

(60) Provisional application No. 61/799,468, filed on Mar. 15, 2013.

(56) References Cited

U.S. PATENT DOCUMENTS

| | | | |
|---|---|---|---|
| 8,658,504 | B2 | 2/2014 | Sudo |
| 9,153,670 | B2 * | 10/2015 | Wang .................. H01L 29/785 |
| 2009/0008705 | A1 | 1/2009 | Zhu et al. |
| 2009/0009806 | A1 | 1/2009 | Matsuda |
| 2010/0144121 | A1 | 6/2010 | Chang et al. |
| 2011/0193178 | A1 * | 8/2011 | Chang .............. H01L 29/66795 257/408 |
| 2011/0210404 | A1 | 9/2011 | Su et al. |
| 2011/0233679 | A1 | 9/2011 | Chen et al. |
| 2011/0248348 | A1 | 10/2011 | Gan et al. |
| 2011/0278676 | A1 | 11/2011 | Cheng et al. |
| 2012/0001197 | A1 | 1/2012 | Liaw et al. |
| 2014/0197456 | A1 | 7/2014 | Wang et al. |
| 2014/0197457 | A1 | 7/2014 | Wang et al. |

OTHER PUBLICATIONS

Gossman, et al, "On the FinFET Extension Implant Energy," IEEE Transactions on Nanotechnology, vol. 2, Issue 4, Dec. 2003, pp. 285-290.

Legoues et al., "Kinetics and mechanism of oxidation of SiGe: dry versus wet oxidation," AIP Applied Physics Letters, vol. 54, No. 7, Feb. 1989, 4 pages.

Pei, G. et al., "FinFET Design Considerations Based on 3-D Simulation and Analytical Modeling," IEEE Transactions on Electron Devices, vol. 49, Issue. 8, Aug. 7, 2002, pp. 1411-1419.

Tanaka et al., "Abnormal oxidation characteristics of Si Ge Si-on-insulator structures depending on piled-up Ge fraction at Si O 2 Si Ge interface," AIP Journal of Applied Physics, vol. 103, Mar. 2008, 6 pages.

Tetelin et al., "Kinetics and mechanism of low temperature atomic oxygen-assisted oxidation of SiGe layers," AIP Journal of Applied Physics, vol. 83, No. 5, Mar. 1998, 6 pages.

* cited by examiner

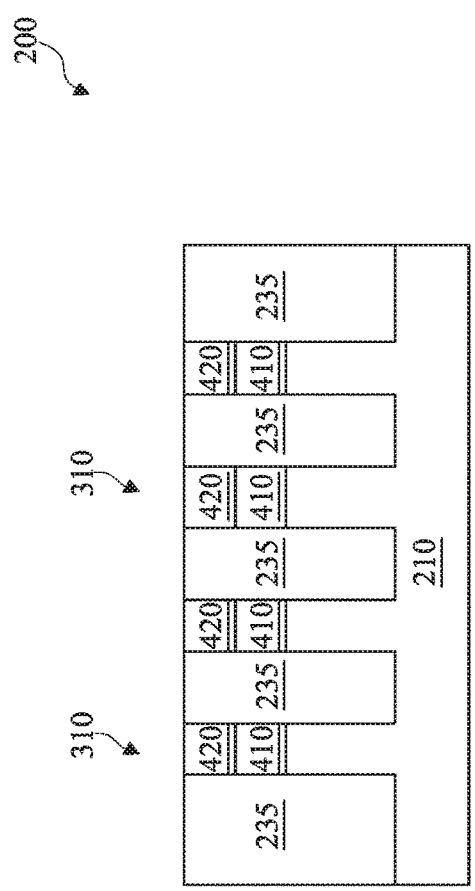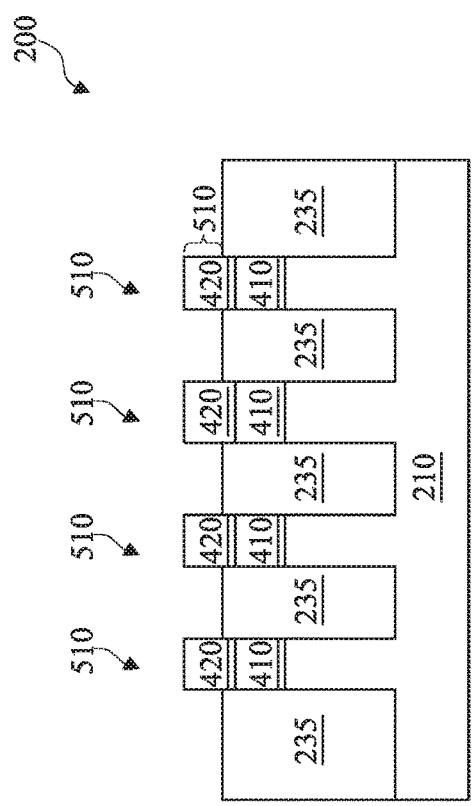

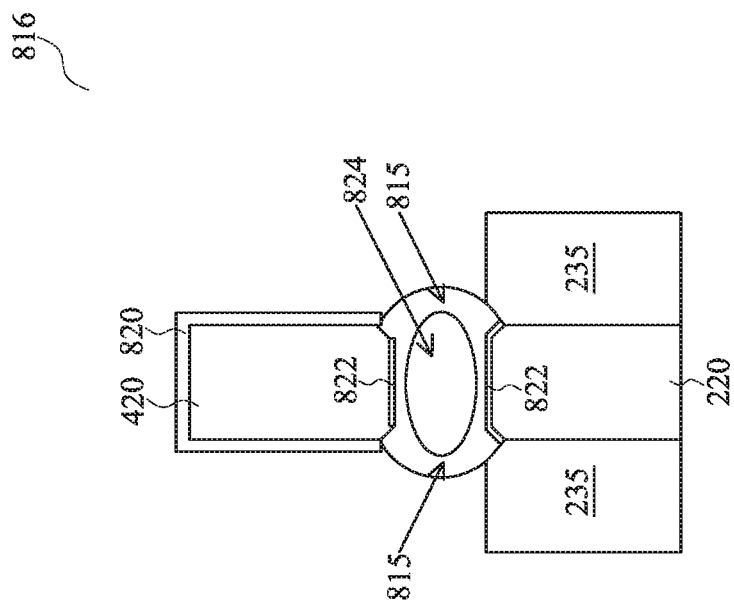
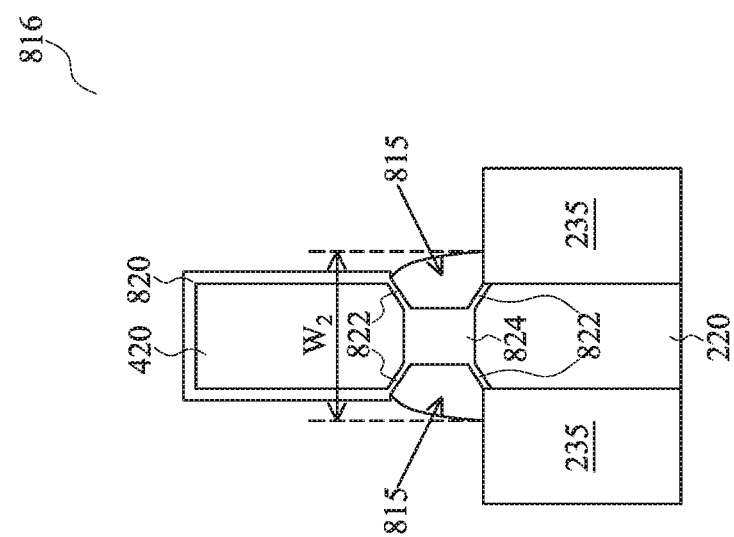

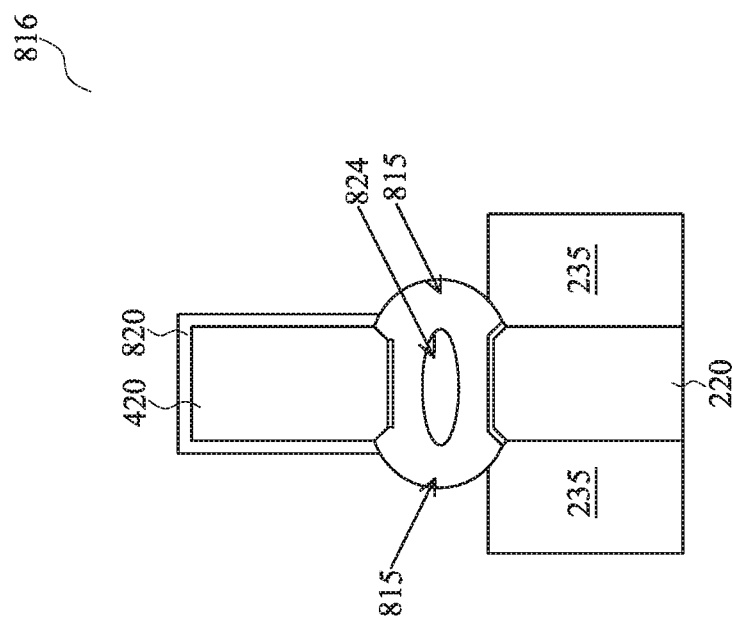
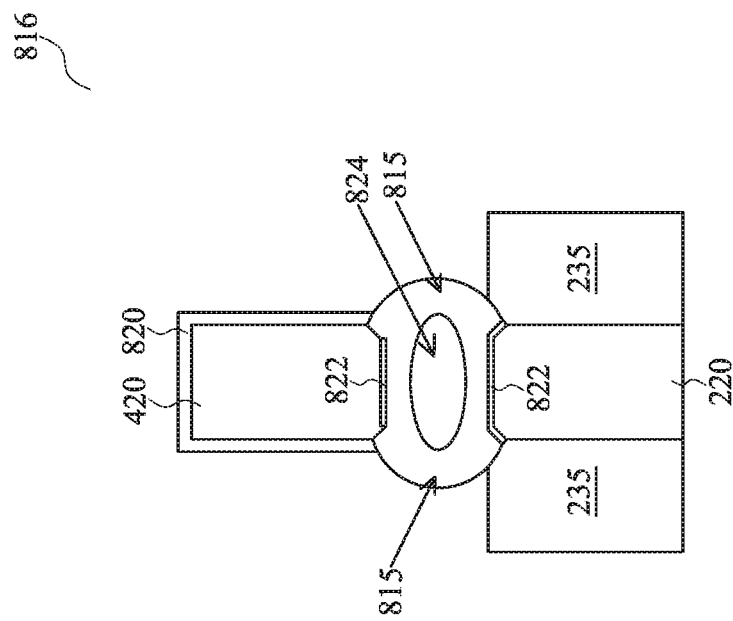

US 10,622,480 B2

FORMING GATE STACKS OF FINFETS THROUGH OXIDATION

PRIORITY CLAIM AND CROSS-REFERENCE

This application is a continuation of U.S. patent application Ser. No. 14/017,036, entitled "FinFET Device and Method Fabricating Same," filed Sep. 3, 2013, which is a continuation-in-part of U.S. patent application Ser. No. 13/740,373, entitled "Semiconductor Device and Fabricating the Same," filed Jan. 14, 2013, now U.S. Pat. No. 8,901,607 issued Dec. 2, 2014 and U.S. patent application Ser. No. 13/902,322, entitled "FinFET Device and Method of Fabricating Same," filed May 24, 2013, now U.S. Pat. No. 9,318,606 issued Apr. 19, 2016, which application further claims the benefit of U.S. Patent Application No. 61/799,468, entitled "Tensile Strain on a FinFET," filed Mar. 15, 2013, which applications are hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects. Improvements in this area are desired.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 4 through 6 are cross-sectional views of an example FinFET device along line A-A in FIG. 2A at fabrication stages constructed according to the method of FIG. 1;

FIGS. 11B, 11C, 11D, and 11E are cross-sectional views of the oxidized silicon germanium and the overlying and underlying semiconductor regions;

DETAILED DESCRIPTION

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Fin Field-Effect Transistor (FinFET) and the method of forming the same are provided in accordance with various exemplary embodiments. The intermediate stages of forming the FinFET are illustrated. The variations of the embodiments are discussed. Throughout the various views and illustrative embodiments, like reference numbers are used to designate like elements.

The present disclosure is directed to, but not otherwise limited to, a FinFET device. The FinFET device, for example, may be a part of a complementary metal-oxide-semiconductor (CMOS) device, and may be a P-type metal-oxide-semiconductor (PMOS) FinFET device or an N-type metal-oxide-semiconductor (NMOS) FinFET device. The following disclosure will continue with a FinFET example to illustrate various embodiments of the present disclosure. It is understood, however, that the application should not be limited to a particular type of device, except as specifically claimed.

Figure 1:
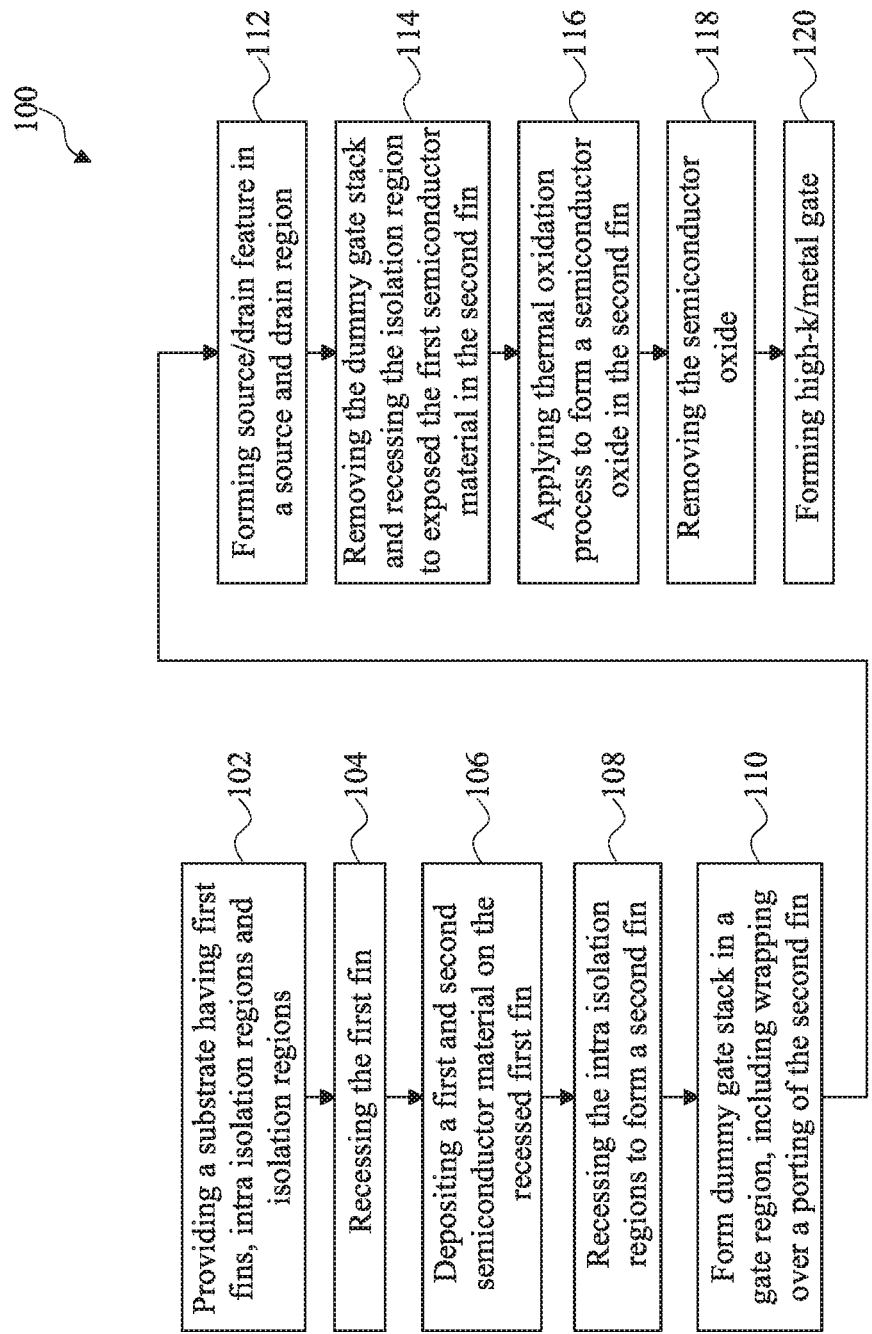
FIG. 1 is a flow chart of an example method for fabricating a FinFET device according to various aspects of the present disclosure.

FIG. 1 is a flowchart of a method 100 for fabricating a FinFET device according to some aspects of the present disclosure. It is understood that additional steps can be provided before, during, and after the process steps shown in the process flow, and some of the steps described can be replaced or eliminated for other embodiments of the method. The disclosure also discusses several different embodiments of a FinFET device 200, as shown in FIGS. 2A-13, manufactured according to the method 100. The present disclosure repeats reference numerals and/or letters in the various embodiments.

Figure 2A:
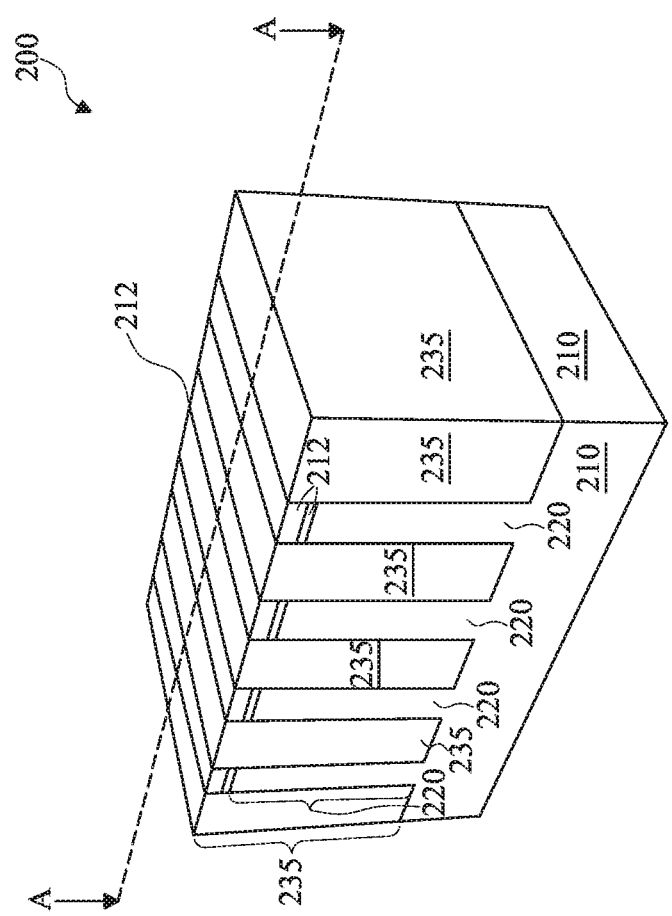
FIG. 2A is a diagrammatic perspective view of a FinFET device undergoing processes according to an embodiment of the present disclosure.
Figure 2B:
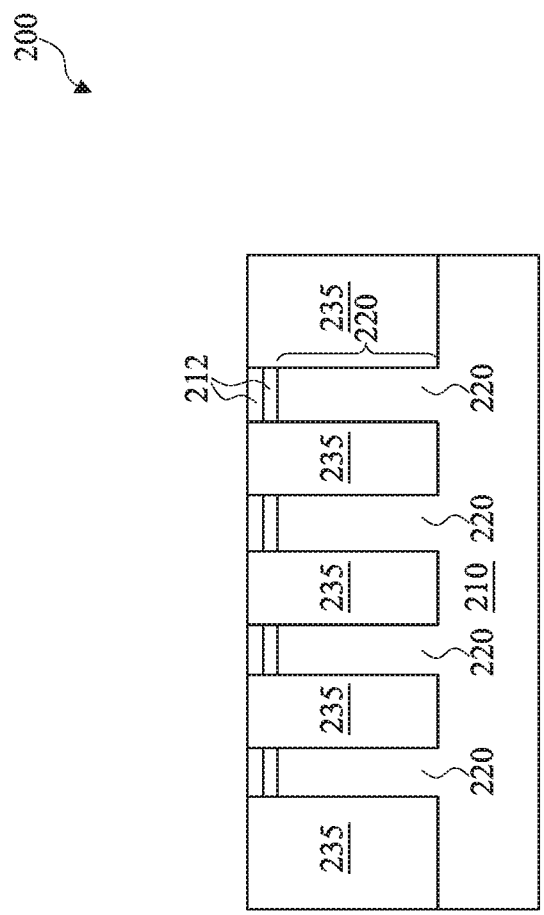
FIG. 2B is a cross-sectional view of an example FinFET device along line A-A in FIG. 2A at fabrication stages constructed according to the method of FIG. 1.

Referring to FIGS. 1 and 2A-2B, the method 100 begins at step 102 by providing a substrate 210. In some embodiments, the substrate 210 is a bulk silicon substrate. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET precursors, the insulator layer is a component (e.g., layer) of a silicon-on-insulator substrate.

The substrate 210 may include various doped regions depending on design requirements as known in the art. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

As shown in FIGS. 2A and 2B, semiconductor strips 220 are formed over the substrate 210. In some embodiments, the formation of semiconductor strips 220 is achieved by forming isolation regions 235, so that the portions of substrate 210 in between act as semiconductor strips 220. In some embodiments, isolation regions 235 are formed using traditional isolation technology, such as shallow trench isolation (STI), to define and electrically isolate the various regions. As one example, the formation of an STI regions 235 includes a photolithography process, etching a trench (occupied by STI region 235) in the substrate 210, and filling the trench (for example, by using a chemical vapor deposition process) with one or more dielectric layers. The dielectric material includes silicon oxide, silicon nitride, silicon oxynitride, or other suitable materials, or combinations thereof. Additionally, a chemical mechanical polishing (CMP) process is performed to remove excessive dielectric layers and planarize the top surface of the resulting isolation regions 235 with the top surfaces of the semiconductor strips 220. First hard mask 212 is also removed.

Figure 3A:
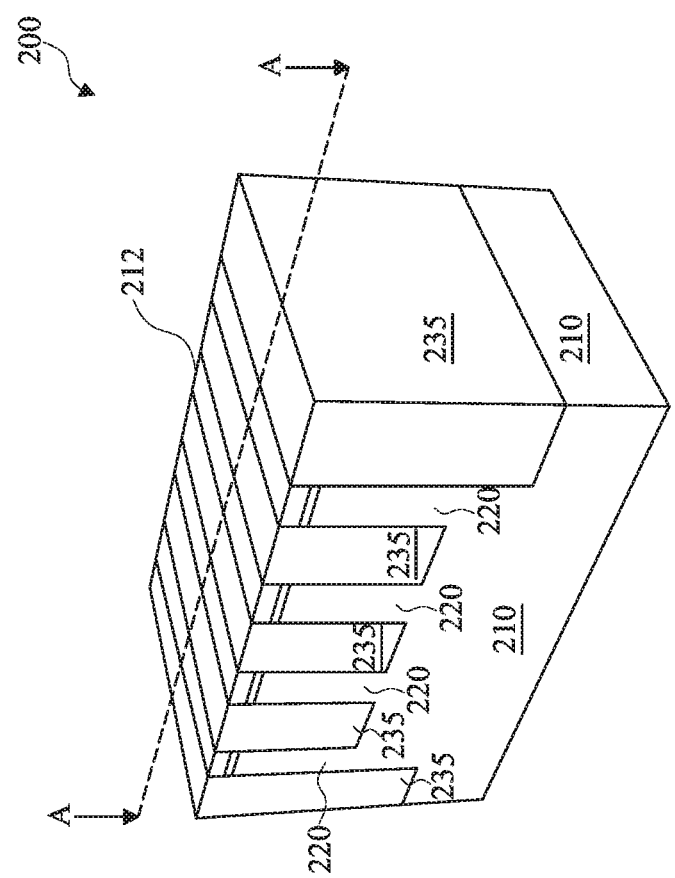
FIG. 3A is a diagrammatic perspective view of a FinFET device undergoing processes according to an embodiment of the present disclosure.
Figure 3B:
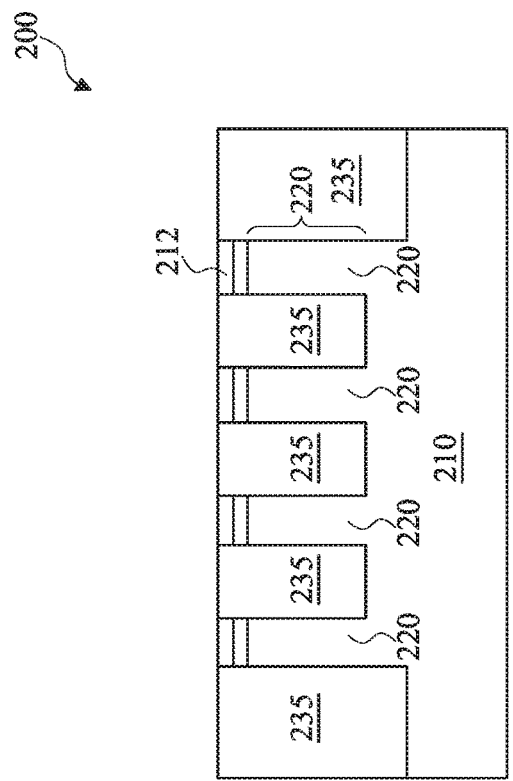
FIG. 3B is a cross-sectional view of an example FinFET device along line A-A in FIG. 3A at fabrication stages constructed according to the method of FIG. 1.

Referring to FIGS. 3A and 3B, in another embodiment, STI regions 235 include two edge STI regions 235 having a depth greater than the depth of the inner STI regions 235 therebetween. The edge STI regions and the inner STI regions 235 may be formed in separate process steps.

Figure 4:
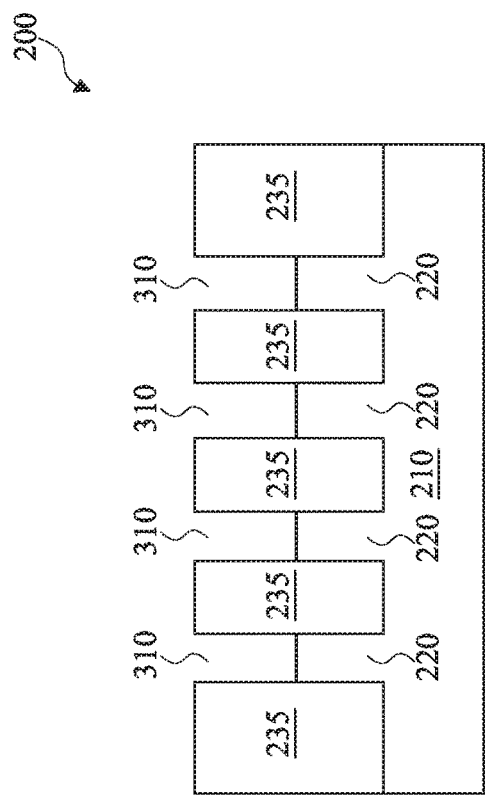

Referring to FIGS. 1 and 4, the method 100 proceeds to step 104 by recessing the semiconductor strips 220 to form trenches 310 (occupied by semiconductor material layers 410 and 420). The recessing process may include a dry etching process, a wet etching process, and/or combination thereof. The recessing process may also include a selective wet etch or a selective dry etch. A wet etching solution includes a tetramethylammonium hydroxide (TMAH), a HF/HNO$_3$/CH$_3$COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include NH$_4$OH, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include CF$_4$, NF$_3$, SF$_6$, and He. The dry etching may also be performed anisotropically using such mechanisms as DRIE (deep reactive-ion etching).

Referring to FIGS. 1 and 5, the method 100 proceeds to step 106 by depositing a first semiconductor material layer 410 to partially fill in the third trenches 310 (FIG. 4) and a second semiconductor material layer 420 over top of the first semiconductor material 410. The first and second semiconductor material layers 410 and 420 may be deposited by epitaxial growing processes. The epitaxial processes include chemical vapor deposition (CVD) deposition techniques (e.g., vapor-phase epitaxy (VPE) and/or ultra-high vacuum CVD (UHV-CVD)), molecular beam epitaxy, and/or other suitable processes. In some embodiments, the first semiconductor material layer 410 is a SiGe layer, and the second semiconductor material layer 420 is a Si layer free from or substantially free from germanium (for example, with a germanium percentage smaller than about 5 percent). First semiconductor material layer 410 may have a germanium percentage in the range between about 15 percent and about 60 percent, although the germanium percentage may be higher or lower. Additionally, a CMP process may be performed to remove excessive semiconductor material layer 420, and planarize top surfaces of the semiconductor material layer 420 and the isolation region 235.

Referring to FIGS. 1 and 6, the method 100 proceeds to step 108 by recessing STI regions 235 around semiconductor material layers 420 and 410 to laterally expose the second semiconductor material layer 420. In some embodiments, the top surfaces of the recessed STI regions 235 are higher than the top surfaces of semiconductor material layer 410. In alternative embodiments, the top surfaces of the recessed STI regions 235 are level with or lower than the top surfaces of semiconductor material layer 410. The portions of semiconductor layers 420 (and possibly 410) higher than the top surfaces of the recessed STI regions 235 are referred to as fins 510. The recessing process may include a dry etching process, a wet etching process, or combination thereof.

Figure 7:
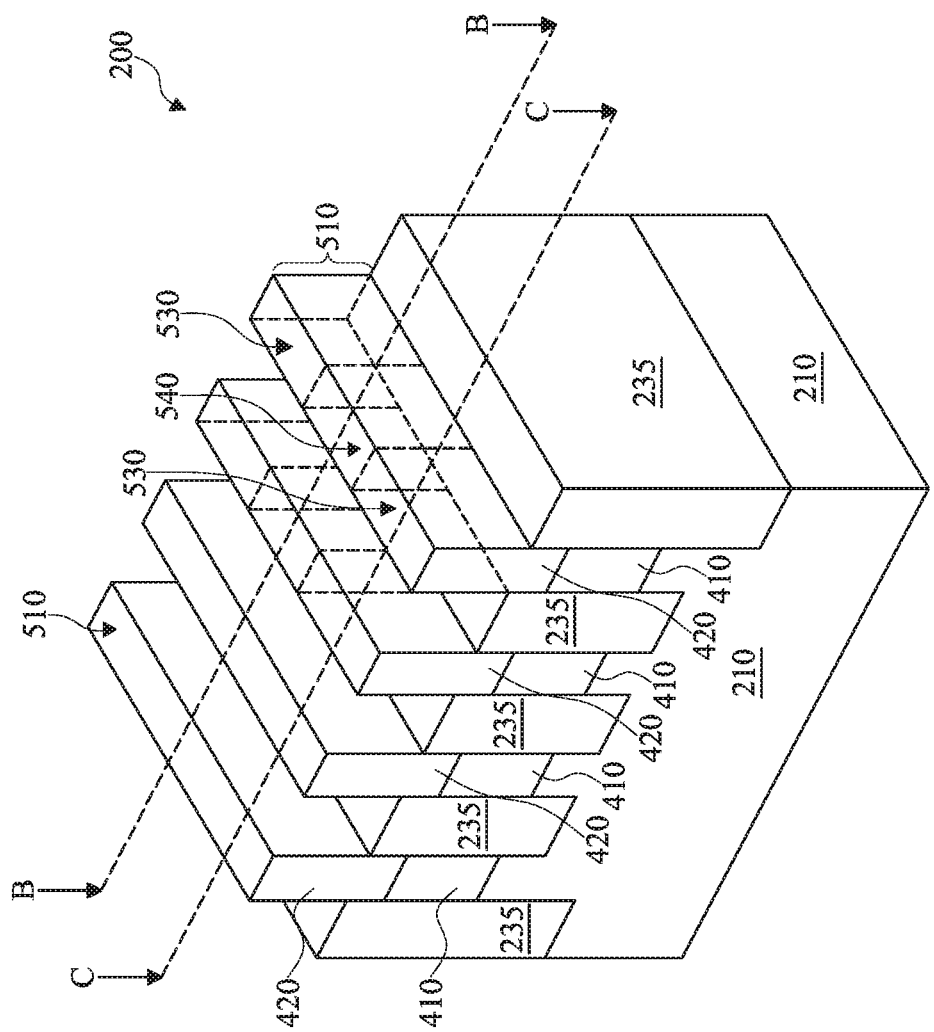
FIG. 7 is a diagrammatic perspective view of a FinFET device undergoing processes according to an embodiment of the present disclosure.

Referring to FIG. 7, in some embodiments, the opposite end portions of the fins 510 are marked as regions 530, which are where source and drain regions to be formed, while the middle portions of fins 510 are referred to as a regions 540. The regions 530 are separated by the regions 540.

Figure 8:
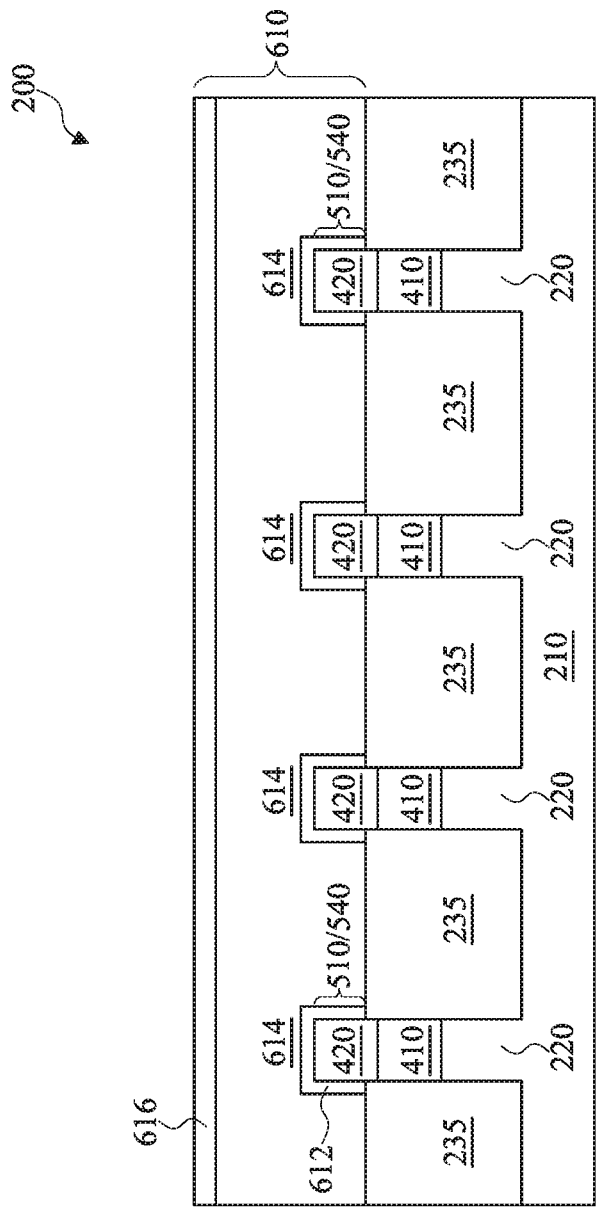
FIGS. 8, 9A, 9B, 10, 11A, 12, and 13 are cross-sectional views of an example FinFET device along line B-B in FIG. 7 at fabrication stages constructed according to the method of FIG. 1.

Referring to FIGS. 1 and 8, the method 100 proceeds to step 110 by forming a gate stack 610 to cover the regions 540. FIG. 8 illustrates the cross-sectional view obtained from the same plane crossing line B-B in FIG. 7. As shown in FIG. 8, gate stack 610 wraps over regions 540. Sidewall spacers (not shown) as they are not in the illustrated plane) are also formed on the sidewalls of the gate stack 610. The gate stack 610 is a dummy gate, and the dummy gate stack 610 is to be replaced later by a high-k (HK) and metal gate (MG) after high thermal temperature processes are performed, such as thermal processes during sources/drains formation. The dummy gate stack 610 may include a dielectric layer 612, a polysilicon layer 614, and a hard mask 616. The dummy gate stack 610 is formed by any suitable process or processes. For example, the gate stack 610 can be formed by a procedure including depositing, photolithography patterning, and etching processes. The deposition processes include CVD, physical vapor deposition (PVD), ALD, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods (e.g., reactive ion etching). The dielectric layer 612 includes silicon oxide, silicon nitride, or any other suitable materials. The hard mask 616 includes any suitable material, for example, silicon nitride, silicon oxynitride and silicon carbide.

The sidewall spacers may include a dielectric material such as silicon oxide, silicon nitride, silicon carbide, silicon oxynitride, or combinations thereof. The sidewall spacers may include a multiple layers. Typical formation methods for the sidewall spacers include depositing a dielectric material over the gate stack 610 and then anisotropically etching back the dielectric material. The etching back process may include a multiple-step etching to gain etch selectivity, flexibility and desired over-etch control.

Figure 9A:
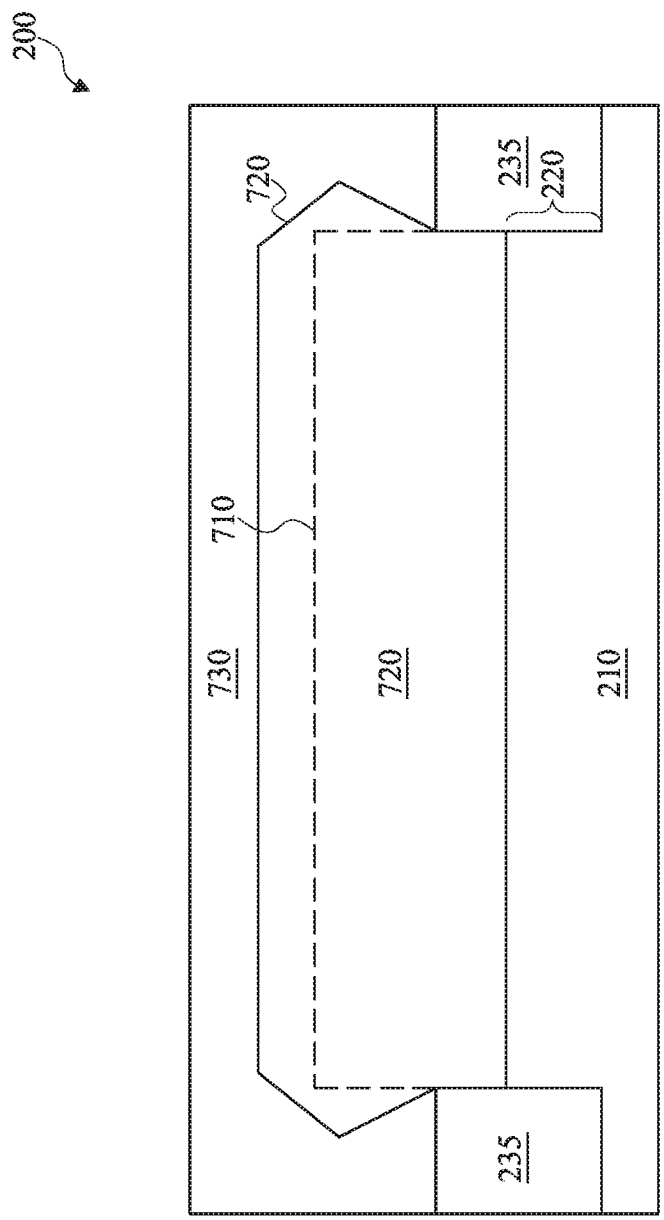
Figure 9B:
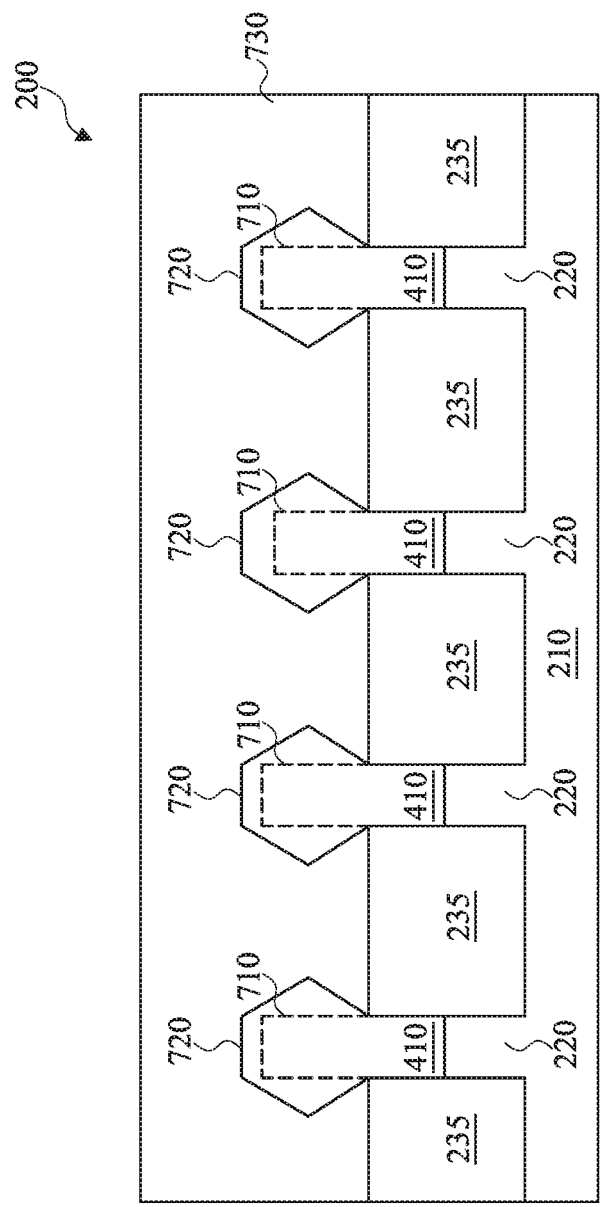

Referring again to FIGS. 1 and 9A, the method 100 proceeds to step 112 by forming a source/drain feature 720 in the source/drain regions 530. FIG. 9A and the subsequently shown FIG. 9B illustrate the cross-sectional views obtained from a plane that is the same as the plane crossing line B-B in FIG. 7. In some embodiments, the end portions 530 (FIG. 7) of fins 510 are removed, as well as the dielectric layer 235 between fins 510, to form a common source/drain trench 710 (occupied by source/drain region 720) over the substrate 210. The recessing process may include dry etching process, wet etching process, and/or combination thereof. The recessing process may also include a selective wet etch or a selective dry etch. The recessing process may include multiple etching processes. In another embodiment, as shown in FIG. 9B, instead of forming a common source/drain trench 710, fins 510 are recessed, while the STI regions 235 between fins 510 are not recessed. Accordingly, a plurality of source/drain trenches 710 are formed between two STI regions 235.

A third semiconductor material epitaxially grows in the source/drain trench 710 to form the source/drain feature 720. The third semiconductor material includes Ge, Si, GaAs, AlGaAs, SiGe, GaAsP, or other suitable material. The common source/drain feature 720 may be formed by one or more epitaxy or epitaxial (epi) processes. The source/drain features 720 may be in-situ doped during the epi process. For example, the epitaxially grown SiGe source/drain features 720 may be doped with boron, and the epitaxially grown Si epi source/drain features 720 may be doped with carbon to form Si:C source/drain features, phosphorous to form Si:P source/drain features, or both carbon and phosphorous to form SiCP source/drain features. In some embodiments, the source/drain features 720 are not in-situ doped, and an implantation process (i.e., a junction implant process) is performed to dope the source/drain features 720.

In some embodiments, as shown in FIG. 9A, a source/drain feature 720 is formed by epitaxially growing the third semiconductor material in the common source/drain trench 710. In another embodiment, as shown in FIG. 9B, multiple source/drain features 720 are formed between isolation regions 235 by epitaxially growing the third semiconductor material in the individual source/drain trenches 710 that are left by the removed semiconductor material 420. In these embodiments, the STI regions 235 that separate individual semiconductor material layers 410 and 420 are not recessed when semiconductor material layers 420 are recessed.

Additionally, as shown in FIGS. 9A and 9B, an interlayer dielectric (ILD) layer 730 is formed to cover source/drain feature 710. The ILD layer 730 includes silicon oxide, oxynitride or other suitable materials. The ILD layer 730 includes a single layer or multiple layers. The ILD layer 730 is formed by a suitable technique, such as CVD, ALD and spin-on (SOG). A chemical mechanical polishing (CMP) process may be performed to remove excessive ILD layer 730 and planarize the top surface of the ILD layer 730 with the top surface of the dummy gate stack 610.

Figure 10:
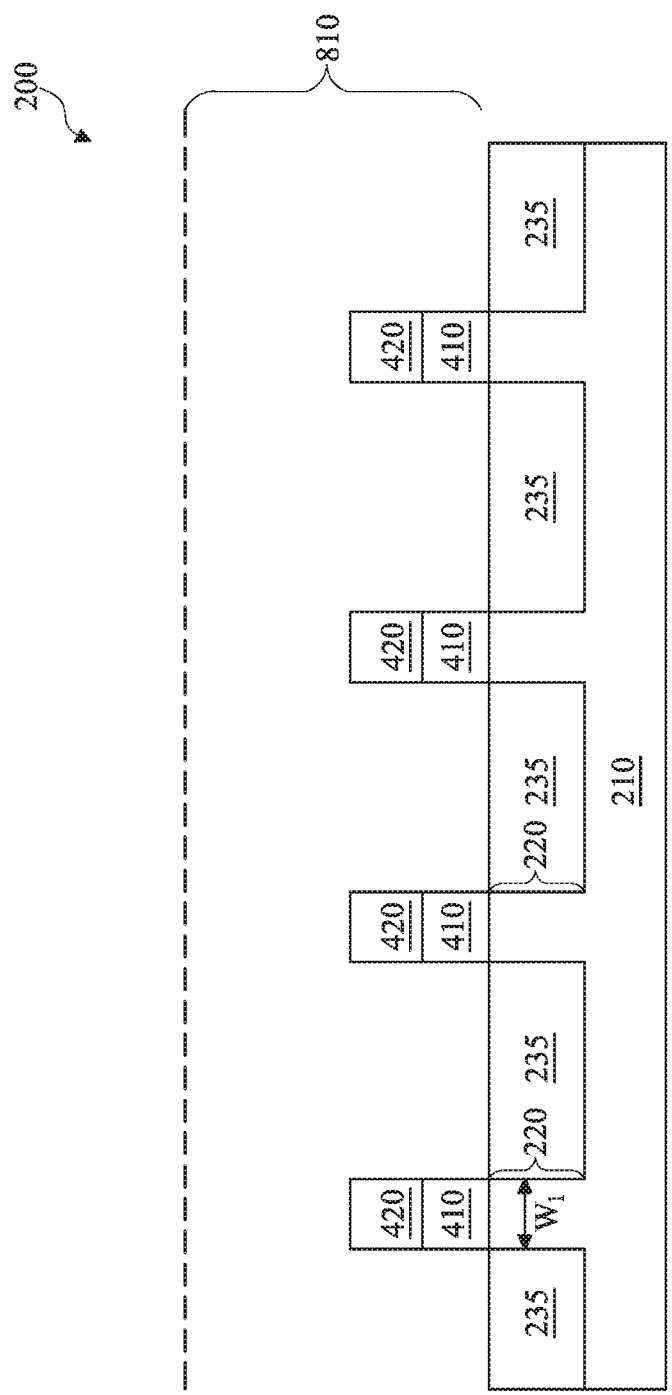

The subsequently illustrated FIGS. 10 through 13 are obtained from a vertical plane that is the same as the plane crossing line B-B in FIG. 7. Referring to FIGS. 1 and 10, the method 100 proceeds to step 114 by removing the dummy gate stack 610 (FIG. 8) to form a gate trench 810. In addition, STI regions 235 in the gate trench 810 are also recessed to expose at least a portion, or substantially an entirety, of the first semiconductor material layer 410, if it is not exposed yet. The etching processes may include selective wet etch or selective dry etch, such that having an adequate etch selectivity with respect to the first and second semiconductor material layers, 410 and 420. Alternatively, the dummy gate stack 610 and the dielectric layer 235 may be recessed by a series of processes including photolithography patterning and etching back. After the recess, the first semiconductor material layer 410 has a first width $w_1$.

Figure 11A:
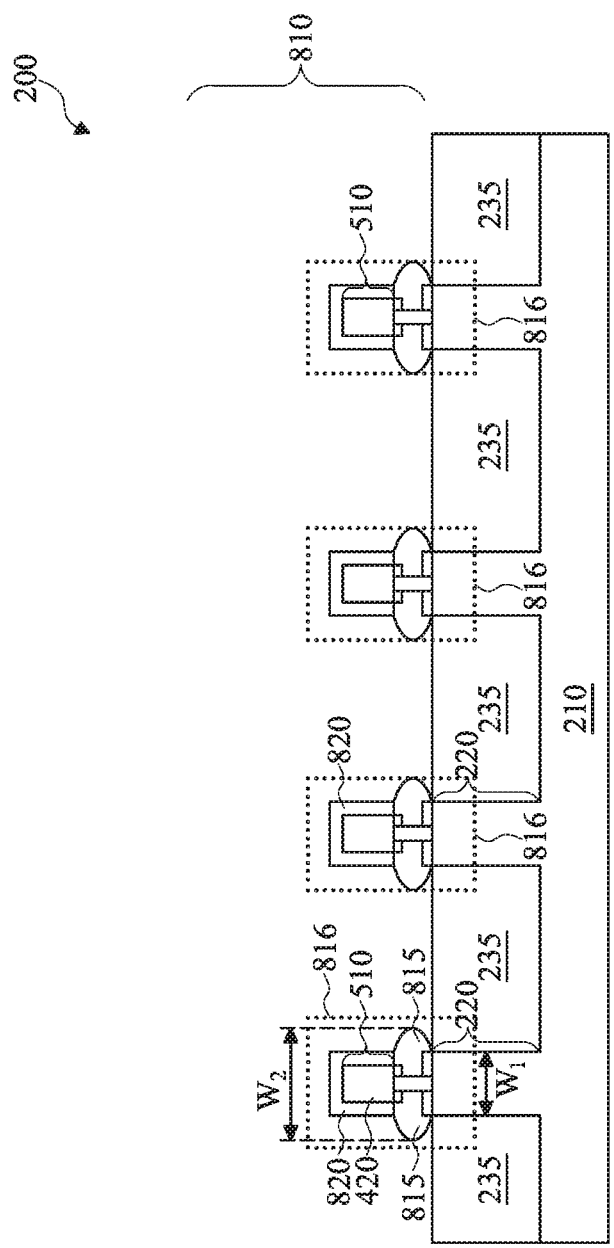
Figure 11F:
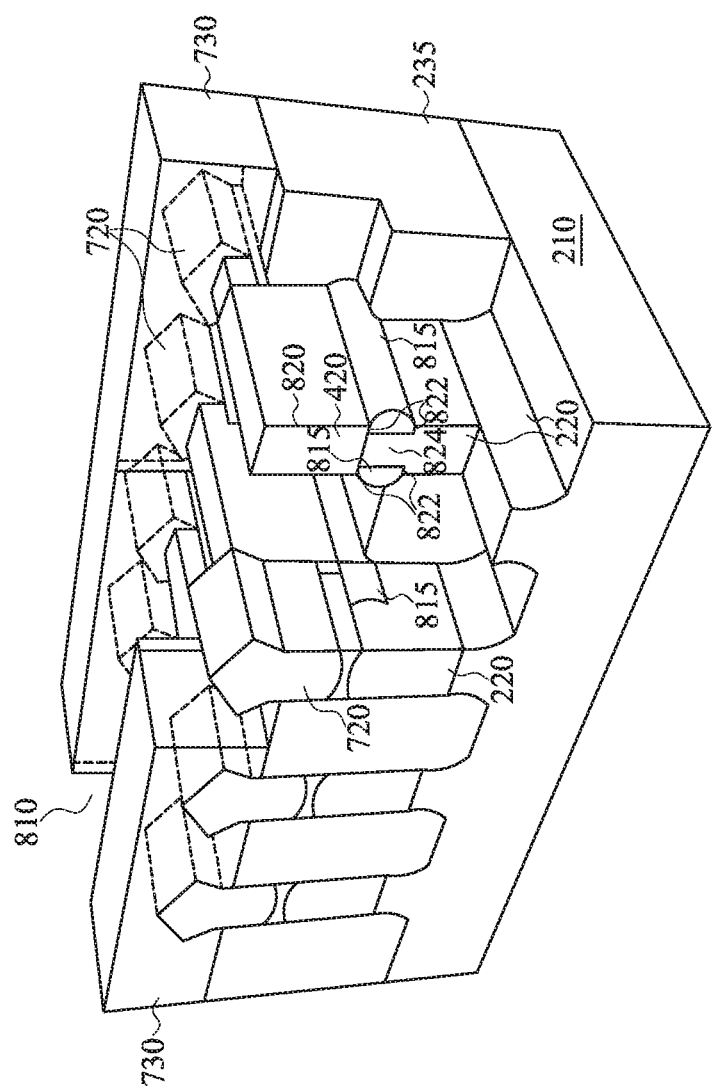
FIG. 11F illustrates a perspective view of an intermediate stage in the formation of the FinFET in accordance with some embodiments, wherein the cross-sectional view in FIG. 11B is obtained the plane crossing line C-C in FIG. 11F.
Figure 11G:
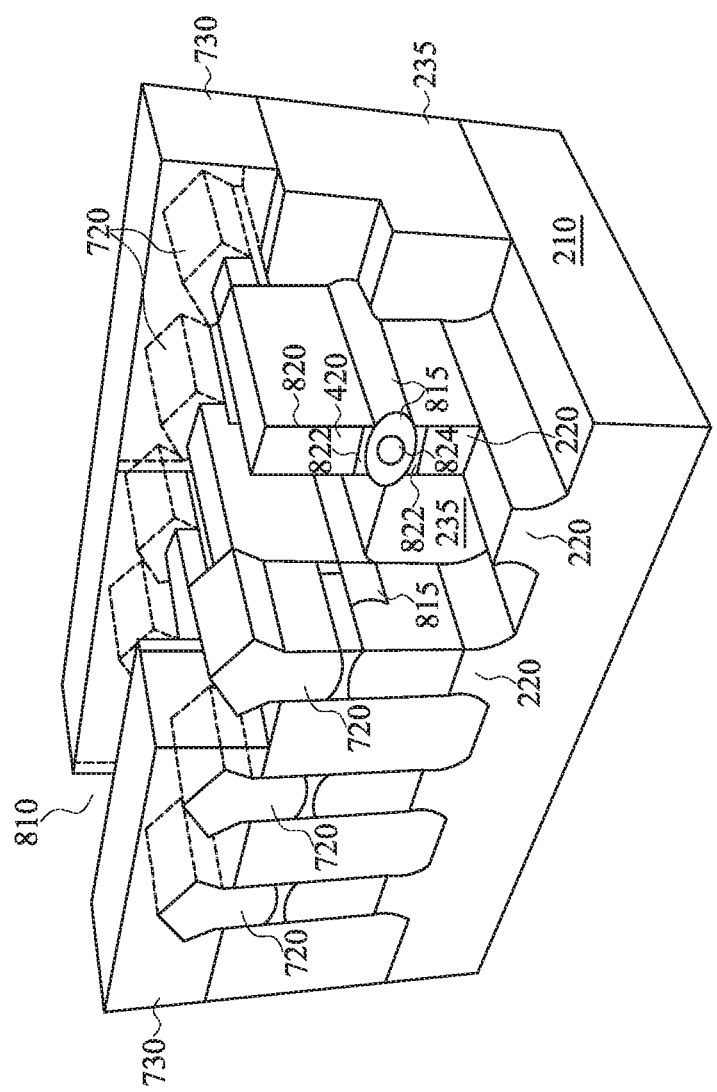
FIG. 11G illustrates a perspective view of an intermediate stage in the formation of the FinFET in accordance with alternative embodiments, wherein the cross-sectional views in FIGS. 11C, 11D, and 11E are obtained from the plane crossing line C-C in FIG. 11G.

Referring to FIGS. 1, 11F, and 11G, the method 100 proceeds to step 116 by performing a thermal oxidation process to the exposed first and second semiconductor material layers 410 and 420 in the gate trench 810. To illustrate the features behind the front portion of ILD 730, some portions of features such as semiconductor strips 220, source/drain regions 720, STI regions 235, and the like are not shown in FIGS. 11F and 11G, so that the inner features may be illustrated. It is appreciated that the un-illustrated portions of ILD 730, semiconductor strips 220, source/drain regions 720, and STI regions 235 still exist.

FIG. 11A illustrates a cross-sectional view of the structure obtained from FIGS. 11F and 11G and from the plane crossing line B-B in FIGS. 11F and 11G. Regions 420, 815, and 820 as shown in FIG. 11A are schematic, and the details of regions 816 (including regions 420, 815, and 820 therein) may be found referring to the magnified cross-sectional view shown in FIGS. 11B, 11C, 11D, and 11E in accordance with various embodiments. In some embodiments, the thermal oxidation process is conducted in an oxygen-containing ambient. In another embodiment, the thermal oxidation process is conducted in a combination of a steam ambient and an oxygen-containing ambient. During the thermal oxidation process, portions of the exposed first semiconductor material layer 410 (FIG. 7) are converted to semiconductor oxide regions 815 with a second width $w_2$, and simultaneously, at least an outer layer of the exposed second semiconductor material layer 420 is converted to a second semiconductor oxide 820.

During the thermal oxidation process, the first semiconductor material layer 410 obtains a volume expansion. In some embodiments, the semiconductor material layers 410 and 420 and the thermal oxidation process are configured that the first semiconductor material layer 410 obtains a volume expansion with a ratio of $w_2$ to $w_1$ being larger than 1.6 to achieve a desired degree of channel strain, such as 1 Gpa of tensile strain. It is realized, however, that the ratios of the volume expansion may change in different embodiments.

In some embodiments, the oxidation is performed at a temperature between about 400° C. and 600° C. The oxidation time may range between about 2 minutes and about 4 hours, for example. Depending on the temperature and the oxidation time, different profiles may be achieved, as shown in FIGS. 11B, 11C, and 11E.

The oxidation of silicon in a silicon germanium region is easier than the oxidation of germanium in the same silicon germanium region. Accordingly, the silicon atoms in semiconductor material layers 410 are oxidized, and the germanium atoms in silicon semiconductor material layers 410 remain substantially un-oxidized. The germanium atoms may diffuse inwardly toward the centers of semiconductor material layers 410 to form region 824 (FIGS. 11B, 11C, 11D, and 11E), and/or to the interface regions between semiconductor material layers 410 and the underlying/overlying semiconductor regions 420/220 to form layers 822. The silicon atoms may diffuse outwardly toward the edges of semiconductor material layers 410, and are oxidized to form oxide regions 815, as shown in FIGS. 11B, 11C, 11D, and 11E.

FIGS. 11B, 11C, 11D, and 11E illustrate a plurality of likely profiles in regions 816 in FIG. 11A. For example, FIG. 11B illustrates a profile, wherein the respective oxidation process adopts a relatively low temperature and/or relatively short oxidation time. When the temperature and/or relatively short oxidation time are increased, the profile of regions 816 may become what is shown in FIG. 11C, FIG. 11D, and eventually FIG. 11E. For example, when the oxidation temperature is about 450° C., the oxidation duration in the range between about 20 minutes and about 40 minutes results in the profile shown in FIG. 11B, the oxidation duration in the range between about 40 minutes and about 60 minutes results in the profile shown in FIG. 11C, the oxidation duration in the range between about 80 minutes and about 140 minutes results in the profile shown in FIG. 11D, and the oxidation duration in the range between about 140 minutes and about 180 minutes results in the profile shown in FIG. 11E.

When the oxidation temperature is increased, the oxidation duration may be reduced to achieve the same profile. For example, when the oxidation temperature is increased to about 500° C., the oxidation duration in the range between about 5 minutes and about 15 minutes results in the profile shown in FIG. 11B, the oxidation duration in the range between about 25 minutes and about 40 minutes results in the profile shown in FIG. 11C, the oxidation duration in the range between about 40 minutes and about 50 minutes results in the profile shown in FIG. 11D, and the oxidation duration in the range between about 50 minutes and about 70 minutes results in the profile shown in FIG. 11E. It is realized that the profile of regions 816 are also related to other factors such as width $w_1$ (FIG. 10) of semiconductor material layer 410, the germanium percentage of semiconductor material layer 410, and the like.

Referring to FIG. 11B, semiconductor material layer 420 is converted into silicon oxide regions 815 and the concentrated center SiGe region 824 and SiGe layers 822. In addition, silicon oxide regions 815 are formed on the opposite sides of the center SiGe region 824. Germanium atoms tend to diffuse inwardly, and hence SiGe region 824 has a germanium concentration higher than the germanium concentration of the original semiconductor material layer 420 (FIG. 8). Furthermore, due to the inward diffusion of germanium atoms, center SiGe region 824 may have a gradient germanium percentage, with the germanium percentage being increasingly and continuously higher from the center of SiGe region 824 to the opposite sidewalls of SiGe region 824. SiGe regions 822 and 824 are alternatively referred to as germanium-containing semiconductor regions throughout the description. Germanium atoms also tend to diffuse toward the interfaces where the SiGe regions contacts silicon regions, and hence SiGe layers 822 are formed between and contacting silicon oxide regions 815 and the overlying semiconductor material layer 420, and between and contacting silicon oxide regions 815 and the underlying semiconductor strip 220. Accordingly, silicon oxide regions 815 are spaced apart from semiconductor material layer 420 and semiconductor strip 220 by silicon germanium layers 822.

With the increase in the oxidation time, more silicon atoms are out-diffused and oxidized, and hence silicon oxide regions 815 grow, and silicon germanium regions 822 and 824 shrink. In the meantime, the germanium percentage in germanium regions 822 and 824 also increases. In some embodiments, germanium regions 822 and 824 as in FIG. 11B become substantially pure germanium regions, for example, with germanium percentages greater than about 95 percent, or greater than about 99 percent. In these embodiments, the oxidation may be stopped. In alternative embodiments, germanium regions 822 and 824 as in FIG. 11B remain to be silicon germanium regions, whose germanium percentages are increased over the semiconductor material layer 420 in FIG. 10. In these embodiments, the oxidation may be continued, and FIGS. 11C, 11D, and 11E illustrate the resulting structures. With the proceeding of the further oxidation, the silicon oxide regions 815 on the opposite sides of center SiGe region 824 join with each other. The respective profiles are shown in FIGS. 11C, 11D, and 11E. Referring to the profile in FIG. 11C, silicon oxide region 815 fully encircles silicon germanium region 824 therein. Furthermore, a top portion of silicon germanium region 824 separates silicon oxide region 815 from semiconductor material layer 420. A bottom portion silicon germanium region 824 separates silicon oxide region 815 from semiconductor strip 220.

Referring to FIG. 11D, with the further increase in the oxidation time, the sizes of silicon germanium region 824 further reduces. The sizes of silicon oxide regions 815 increase also. In the meantime, the germanium percentage in silicon germanium region/layer 824 and 822 are further increased. Eventually, As shown in FIG. 11E, silicon germanium region/layer 824 and/or 822 become substantially pure germanium regions with germanium percentages greater than about 95 percent, or greater than about 99 percent.

Figure 12:
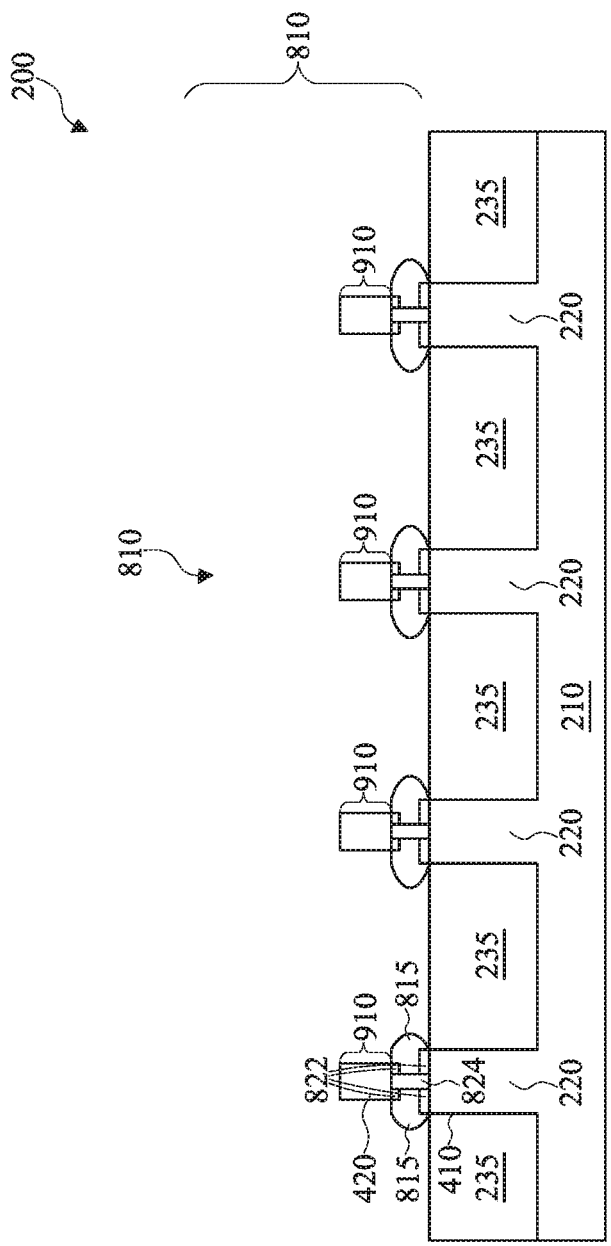

Referring to FIGS. 1 and 12, the method 100 proceeds to step 118 by removing the second semiconductor oxide layer 820 (FIGS. 11A through 11F) and a portion of an outer layer of the oxide regions 815 to reveal fin 910 in trench 810. The removing process includes a dry etch, a wet etch, or a combination of. For example, a selective wet etch or a selective dry etch is performed with adequate etch selectivity with respect to the first and second semiconductor material layers 410 and 420. The fin 910 is configured such that it has the second semiconductor material layer 420 as an upper portion, and the first semiconductor oxide layer 815 as a lower portion.

Figure 13:
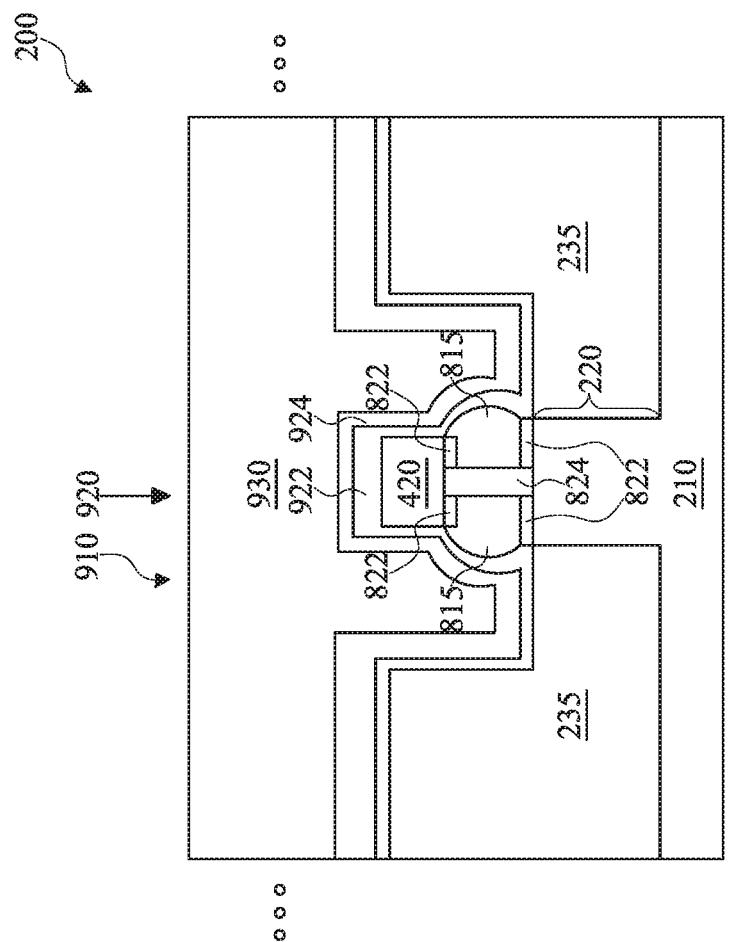

Referring to FIGS. 1 and 13, the method 100 proceeds to step 120 by forming a high-k (HK)/metal gate (MG) 920 in trench 810 (FIG. 12), where the fin 910 serve as gate channel regions. An interfacial layer (IL) 922 may be deposited by any appropriate method, such as ALD, CVD and ozone oxidation. The IL 922 includes oxide, HfSiO and oxynitride. IL 922 may be in contact with fins 910. A HK dielectric layer 924 is deposited over the IL 922 by suitable techniques, such as ALD, CVD, metal-organic CVD (MOCVD), PVD, thermal oxidation, combinations thereof, or other suitable techniques. The HK dielectric layer 924 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfAlO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

A metal gate (MG) layer 930 may include a single layer or multi layers, such as metal layer, liner layer, wetting layer, and adhesion layer. The MG layer 930 may include Ti, Ag, Al, TiAlN, TaC, TaCN, TaSiN, Mn, Zr, TiN, TaN, Ru, Mo, Al, WN, Cu, W, or any suitable materials. The MG layer 930 may be formed by ALD, PVD, CVD, or other suitable process. The MG layer 930 may be formed separately for the N-FET and P-FFET with different metal layers. A CMP may be performed to remove excessive MG layer 930. The CMP provides a substantially planar top surface for the metal gate layer 930 and the ILD layer 730.

The FinFET device 200 may undergo further CMOS or MOS technology processing to form various features and regions known in the art. For example, subsequent processing may form various contacts/vias/lines and multilayers interconnect features (e.g., metal layers and interlayer dielectrics) over the substrate 210, configured to connect the various features or structures of the FinFET device 200. For example, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, the present disclosure offers a semiconductor device with a strained channel by using volume expansion technique. The volume expansion technique induces sufficient strain to the channel to improve device performance.

In accordance with some embodiments, an integrated circuit structure includes a semiconductor substrate, and isolation regions extending into the semiconductor substrate, wherein the isolation regions have opposite sidewalls facing each other. A fin structure includes a silicon fin higher than top surfaces of the isolation regions, a germanium-containing semiconductor region overlapped by the silicon fin, silicon oxide regions on opposite sides of the germanium-containing semiconductor region, and a germanium-containing semiconductor layer between and in contact with the silicon fin and one of the silicon oxide regions.

In accordance with other embodiments, an integrated circuit structure includes a semiconductor substrate, and isolation regions extending into the semiconductor substrate. The isolation regions include opposite sidewalls facing each other. A fin structure includes a silicon fin higher than top surfaces of the isolation regions, a silicon strip between the opposite sidewalls of the isolation regions, wherein sidewalls of the silicon strip are in contact with the opposite sidewalls of the isolation regions, a germanium-containing semiconductor region between aligned to the silicon fin and the silicon strip, and a first and a second silicon oxide region on opposite sides of the germanium-containing semiconductor region. The fin structure further includes a first germanium-containing semiconductor layer between and in contact with the silicon fin and the first silicon oxide region, a second germanium-containing semiconductor layer between and in contact with the silicon fin and the second silicon oxide region, a third germanium-containing semiconductor layer between and in contact with the silicon strip and the first silicon oxide region, and a fourth germanium-containing semiconductor layer between and in contact with the silicon strip and the second silicon oxide region.

In accordance with yet other embodiments, an integrated circuit structure includes a semiconductor substrate, isolation regions extending into the semiconductor substrate, with the isolation regions having opposite sidewalls facing each other, and a fin structure. The fin structure includes a silicon fin higher than top surfaces of the isolation regions, a germanium-containing semiconductor region, and a silicon oxide region. The silicon oxide region includes a first and a second portion on opposite sides of the germanium-containing semiconductor region, and a top portion connecting the first portion to the second portion, wherein the top portion fully separates the germanium-containing semiconductor region from the silicon fin.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a semiconductor region between portions of an isolation region, wherein the semiconductor region comprises:
   a first semiconductor material; and
   a second semiconductor material over the first semiconductor material;
   oxidizing the first semiconductor material to convert the first semiconductor material into an oxide region and a third semiconductor material in the oxide region, wherein during the oxidizing, an oxide layer is formed on the second semiconductor material;
   removing the oxide layer on the second semiconductor material to reveal a top surface and sidewalls of the second semiconductor material;
   forming a gate dielectric on the top surface and the sidewalls of the second semiconductor material; and
   forming a gate electrode on the gate dielectric.

2. The method of claim 1 further comprising:
   recessing the isolation region to expose sidewalls of the second semiconductor material, wherein when the first semiconductor material is oxidized, the sidewalls of the second semiconductor material are exposed.

3. The method of claim 2, wherein when the first semiconductor material is oxidized, at least a top portion of the first semiconductor material is also exposed.

4. The method of claim 1, wherein when the first semiconductor material is oxidized, a middle portion of the first semiconductor material receives concentrated germanium to form the third semiconductor material, and outer portions of the first semiconductor material are oxidized to form the oxide region.

5. The method of claim 4, wherein the oxide region fully encircles the middle portion of the first semiconductor material, and the oxide region electrically decouples the second semiconductor material from a semiconductor substrate underlying the isolation region.

6. The method of claim 1, wherein the first semiconductor material comprises silicon germanium, and the second semiconductor material comprises silicon and has a germanium percentage lower than a germanium percentage of the first semiconductor material.

7. The method of claim 6, wherein the first semiconductor material comprises silicon germanium, and the second semiconductor material comprises silicon and is free from germanium.

8. A method comprising:
forming a semiconductor strip between opposite portions of an isolation region, wherein the semiconductor strip comprises a silicon germanium layer and a silicon layer over the silicon germanium layer;
recessing the isolation region, and a top portion of the semiconductor strip forms a semiconductor fin protruding higher than a top surface of the isolation region;
forming a dummy gate covering a first portion of the semiconductor fin;
forming a source/drain region based on a second portion of the semiconductor fin;
removing the dummy gate to reveal the first portion of the semiconductor fin;
oxidizing the silicon germanium layer to form an oxide region, wherein when the silicon germanium layer is oxidized, germanium in outer portions of the silicon germanium layer is concentrated to a middle portion of the silicon germanium layer, and after the oxidizing the silicon germanium layer, the middle portion remains as a semiconductor material, wherein during the oxidizing, an oxide layer is formed on the silicon layer;
removing the oxide layer on the silicon layer; and
forming a gate on the silicon layer.

9. The method of claim 8, wherein a portion of the silicon germanium layer concentrated with germanium comprises a portion extending to, and in contact with, the isolation region.

10. The method of claim 8, wherein after the oxidizing the silicon germanium layer, in a cross-sectional view of the silicon germanium layer, the oxide region fully encircles a portion of the silicon germanium layer.

11. The method of claim 8, wherein after the recessing the isolation region, a top surface of the isolation region is higher than a top surface of the silicon germanium layer.

12. The method of claim 8, wherein after the recessing the isolation region, a top surface of the isolation region is level with or lower than a top surface of the silicon germanium layer.

13. The method of claim 8, wherein during the oxidizing the silicon germanium layer, the source/drain region is covered by an inter-layer dielectric, and the silicon germanium layer is oxidized through an opening in the inter-layer dielectric, with the opening being formed as a result of the removing the dummy gate.

14. The method of claim 8, wherein during the removing the oxide layer, an outer portion of the oxide region is removed.

15. A method comprising:
forming a silicon fin protruding higher than a top surface of an isolation region, wherein the isolation region comprises portions on opposite sides of the silicon fin;
performing an oxidation on a silicon germanium layer underlying the silicon fin to form an oxide region, wherein germanium in the silicon germanium layer is concentrated to a middle portion of the silicon germanium layer, and the oxide region comprises a first portion overlapping the middle portion, and a second portion overlapped by the middle portion;
removing an oxide layer formed on the silicon fin to reveal a sidewall and a top surface of the silicon fin; and
forming a gate stack on the sidewall and the top surface of the silicon fin, wherein the gate stack comprises a gate dielectric and a metal gate over the gate dielectric.

16. The method of claim 15 further comprising:
forming a dummy gate covering a first portion of the silicon fin;
forming an inter-layer dielectric, with the dummy gate being in the inter-layer dielectric;
forming a source/drain region based on a portion of the silicon fin; and
removing the dummy gate to form an opening in the inter-layer dielectric, wherein the oxidation is performed through the opening.

17. The method of claim 15, wherein when the oxidation is performed, a top portion of the silicon germanium layer is exposed.

18. The method of claim 15, wherein the gate dielectric comprises a high-k dielectric layer, and the high-k dielectric layer contacts the oxide region.

19. The method of claim 15, wherein the oxide region electrically decouples the silicon fin from a semiconductor substrate underlying the silicon germanium layer.

20. The method of claim 15 further comprising:
forming a recess between the portions of the isolation region;
depositing the silicon germanium layer in the recess;
depositing a silicon layer over the silicon germanium layer and in the recess; and
recessing the isolation region, so that at least a top portion of the silicon layer forms the silicon fin.

* * * * *